(12) United States Patent
Kamei

(10) Patent No.: US 7,518,911 B2
(45) Date of Patent: Apr. 14, 2009

(54) METHOD AND SYSTEM FOR PROGRAMMING MULTI-STATE NON-VOLATILE MEMORY DEVICES

(75) Inventor: Teruhiko Kamei, Kanagawa (JP)

(73) Assignee: SanDisk Corporation, Milpitas, CA (US)

( * ) Notice: Subject to any disclaimer, the term of this patent is extended or adjusted under 35 U.S.C. 154(b) by 250 days.

(21) Appl. No.: 11/440,511

(22) Filed: May 25, 2006

(65) Prior Publication Data

US 2007/0274128 A1    Nov. 29, 2007

(51) Int. Cl.
*G11C 16/04* (2006.01)
*G11C 16/10* (2006.01)

(52) U.S. Cl. .......................... 365/185.03; 365/185.24; 365/230.04; 711/103

(58) Field of Classification Search ............ 365/185.03, 365/185.18, 185.11, 185.24, 230.03, 230.04; 711/103
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 5,867,429 A | 2/1999 | Chen et al. | |
| 5,930,167 A * | 7/1999 | Lee et al. | 365/185.03 |
| 6,046,935 A | 4/2000 | Takeuchi et al. | |
| 6,122,193 A * | 9/2000 | Shibata et al. | 365/185.03 |
| 6,151,246 A | 11/2000 | So et al. | |
| 6,418,052 B1 * | 7/2002 | Shibata et al. | 365/185.12 |
| 6,707,078 B1 | 3/2004 | Shiraiwa et al. | |
| 6,707,713 B1 | 3/2004 | Parker et al. | |
| 6,987,696 B1 | 1/2006 | Wang et al. | |
| 7,079,437 B2 | 7/2006 | Hazama et al. | |
| 2002/0136054 A1 * | 9/2002 | Blodgett | 365/185.03 |
| 2003/0048667 A1 * | 3/2003 | Mori et al. | 365/185.33 |
| 2003/0086299 A1 * | 5/2003 | Yoshida | 365/185.22 |
| 2004/0080979 A1 * | 4/2004 | Park | 365/185.03 |

FOREIGN PATENT DOCUMENTS

JP    11340835 A  * 12/1999

OTHER PUBLICATIONS

A JPO computer translation of JP 11340835 A.*

* cited by examiner

*Primary Examiner*—J. H. Hur
(74) *Attorney, Agent, or Firm*—Vierra Magen Marcus & DeNiro LLP

(57) ABSTRACT

A method for programming a non-volatile memory system. The method includes programming a first non-volatile storage element on a first word line and a first NAND string to store "n" bits of data. A second non-volatile storage element on the first word line and a second NAND string is programmed to store n+1 bits of data. The second non-volatile storage element is a neighbor to the first non-volatile storage element. A third non-volatile storage element on a second word line and the second NAND string is programmed to store n bits of data. The third non-volatile storage element is a neighbor to the second non-volatile storage element. A fourth non-volatile storage element on the second word line and the first NAND string is programmed to store n+1 bits of data.

17 Claims, 10 Drawing Sheets

| | Erase | Program Promotion | Program Inhibition | Read10 | Read00 | Read00 for 2nd Pass | Read01 | Verify10 | Verify00 | Verify01 |
|---|---|---|---|---|---|---|---|---|---|---|
| BLe | Floating | 0V | Vdd | H or L | H or L | H or L | H or L | H or L | H or L | H or L |
| BLo | Floating | Vdd | Vdd | 0V | 0V | 0V | 0V | 0V | 0V | 0V |
| SGD | Floating | Vdd | Vdd | 4.5V | 4.5V | 4.5V | 4.5V | 4.5V | 4.5V | 4.5V |
| WL3 | 0V | 10V | 10V | 4.5V | 4.5V | 4.5V | 4.5V | 4.5V | 4.5V | 4.5V |
| WL2 | 0V | Vpgm | Vpgm | 0V | 1V | 1V | 2V | 0.4V | 1.4V | 2.4V |
| WL1 | 0V | 10V | 10V | 4.5V | 4.5V | 4.5V | 4.5V | 4.5V | 4.5V | 4.5V |
| WL0 | 0V | 10V | 10V | 4.5V | 4.5V | 4.5V | 4.5V | 4.5V | 4.5V | 4.5V |
| SGS | Floating | 0V | 0V | 4.5V | 4.5V | 4.5V | 4.5V | 4.5V | 4.5V | 4.5V |
| C-source | Floating | 0V | 0V | 0V | 0V | 0V | 0V | 0V | 0V | 0V |
| C-p-well | 20V | 0V | 0V | 0V | 0V | 0V | 0V | 0V | 0V | 0V |

FIG. 6

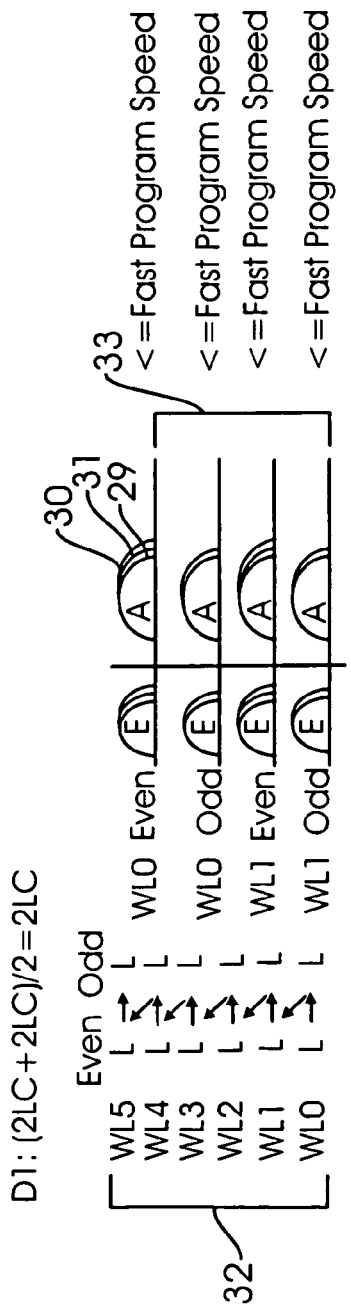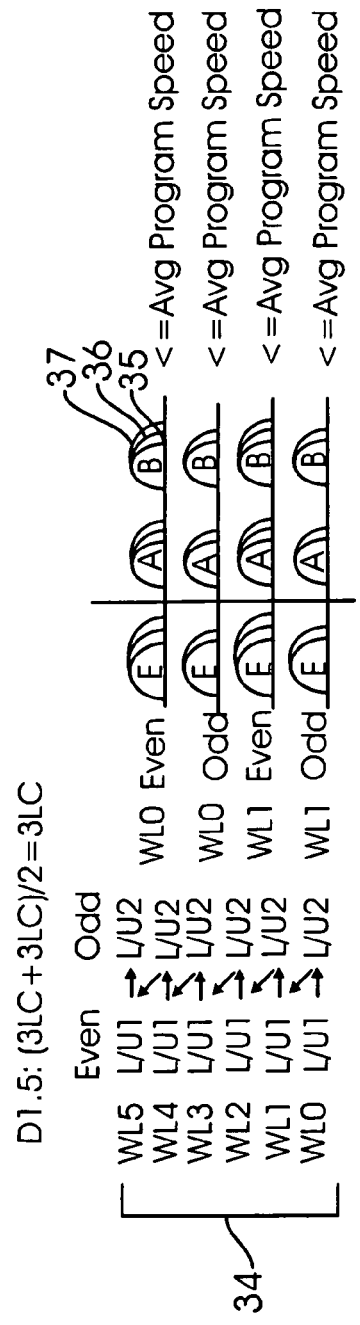

|     |     |     |     |
| --- | --- | --- | --- |
| 4LC | 2LC | 4LC | 2LC |
| 2LC | 4LC | 2LC | 4LC |

3LC Pattern
FIG. 11A

|     |     |     |     |
| --- | --- | --- | --- |
| 8LC | 4LC | 8LC | 4LC |
| 4LC | 8LC | 4LC | 8LC |

FIG. 11B

|     |     |     |     |
| --- | --- | --- | --- |
| 16LC | 8LC | 16LC | 8LC |
| 8LC | 16LC | 8LC | 16LC |

FIG. 11C

METHOD AND SYSTEM FOR PROGRAMMING MULTI-STATE NON-VOLATILE MEMORY DEVICES

CROSS-REFERENCE TO RELATED APPLICATIONS

None

BACKGROUND

1. Field of the Invention

The present invention is related to flash memory devices/systems, and more particularly, to programming multi-state flash memory cells.

2. Background of the Invention

Semiconductor memory devices have become popular for use in various electronic devices. For example, non-volatile semiconductor memory is used in cellular telephones, digital cameras, personal digital assistants, mobile computing devices, non-mobile computing devices and other electronic devices. Electrical Erasable Programmable Read Only Memory (EEPROM) and flash memory are among the most popular non-volatile semiconductor memories.

One example of a flash memory system uses the NAND structure, which includes arranging multiple transistors in series, sandwiched between two select gates. A NAND array has a number of memory cells (or storage units, used interchangeably throughout this specification), such as 4, 8, 16, or even 32, connected in series string (NAND string) between a bit line and a reference potential through select transistors at either end. Word lines are connected with control gates of cells in different series strings. Relevant examples of NAND arrays and their operation are given in the following U.S. patents that are incorporated herein in their entirety by this reference: U.S. Pat. Nos. 5,570,315, 5,774,397 and 6,046,935.

Flash memory cells can be dual state or multi state. A dual state (2LC) memory cell stores 1 bit of data, while multi-state memory cells can store more data. Current NAND technology can support a 4 state (4LC) memory cell, which can store 2 bits of data. Briefly, two bits of data from different logical pages of incoming data are programmed into one of four states of the individual cells in two steps, first programming a cell into one state according to one bit of data and then, if the data makes it necessary, re-programming that cell into another one of its states according to the second bit of incoming data.

As technology improves, future NAND cells could handle 6 state (6LC), 8 state (8LC) or even 16 state (16LC) memory cells. Programming multi-state memory cells has challenges, especially for a 3 state or a 6 state memory cell. A 3 state memory cell could store 1.5 bits and a 6 state memory cell could store 2.5 bits. Complex calculation circuits will be required to maintain the book-keeping for storing 0.5 bit increments.

Furthermore, during the operation of a non-volatile memory, reading and writing of data in one memory will often disturb the data stored in other memory cells. One source of these disturbs is the field effect coupling between adjacent floating gates as described in U.S. Pat. No. 5,867,429 of Jian Chen and Yupin Fong, which patent is incorporated herein in its entirety by this reference. The degree of these coupling increases as the size of memory cell arrays is being decreased as the result of improvements of integrated circuit manufacturing techniques. The problem occurs most pronouncedly between two sets of adjacent cells that have been programmed at different times. One set of cells is programmed to add a level of charge to their floating gates that corresponds to one set of data. After the second set of cells is programmed with a second set of data, the charge levels read from the floating gates of the first set of cells often appears to be different than programmed because of the effect of the charge on the second set of floating gates being coupled with the first. This is known as the Yupin effect.

To optimize programming speed/minimum Yupin effect, while maintaining simple logic in a high density multi-state memory cell storing data in 0.5 bit increments (for example, in 3LC and 6LC) is a challenge.

SUMMARY OF THE INVENTION

In one aspect of the present invention, a non-volatile memory system is provided. The memory system includes a first set of memory cells that can operate in multiple states X; and a second set of memory cells that can operate in multiple states Y; wherein the multiple state X and multiple state Y are selected so that memory cells can effectively store data in 0.5 bit increments.

In another aspect of the present invention, a method for programming a non-volatile memory system having a pattern of multi-state memory cells, wherein the pattern has a first set of memory cells that can operate in multiple states X and a second set of memory cells that can operate in multiple states Y. The method includes programming an even memory cell of the first set and a first word line and an odd memory cell in the first word line and of the second set is programmed next.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. The illustrated embodiment is intended to illustrate, but not to limit the invention. The drawings include the following:

FIG. 6 provides Table 1 of example operating voltages of the NAND memory cell array of FIGS. 2-5;

FIGS. 10A and 10B show programming techniques for a dual state and 4 state memory cells, respectively;

FIGS. 11A-11C show memory cell layouts, according to one aspect of the present invention;

DETAILED DESCRIPTION OF THE PREFERRED EMBODIMENTS

Example Non-Volatile Memory System

Figure 1:
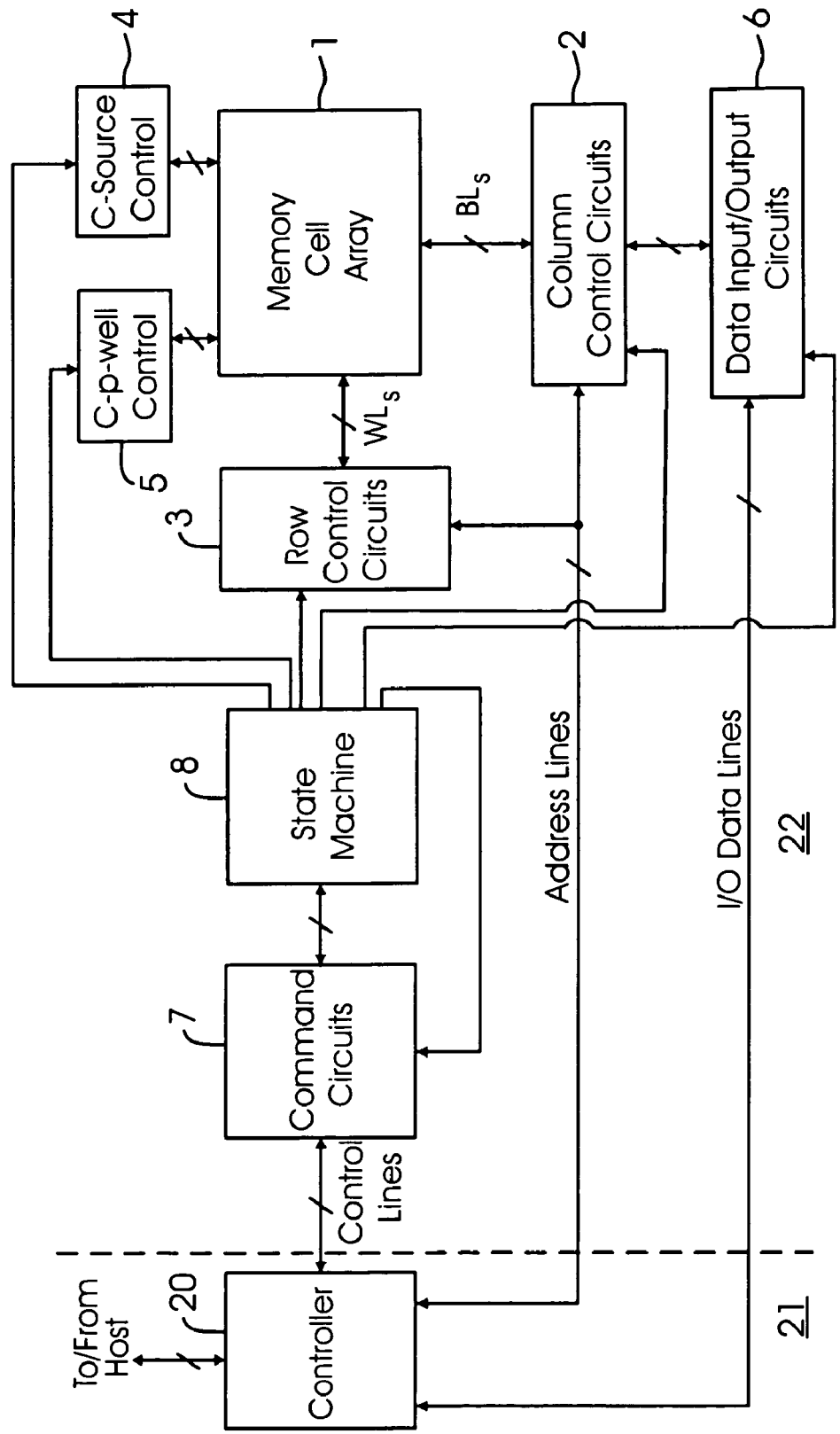
FIG. 1 is a block diagram of a non-volatile memory system in which the various aspects of the present invention are described to be implemented.

With reference to FIGS. 1-7, a specific non-volatile memory system is described in which the various aspects of the present invention are implemented, in order to provide specific examples. FIG. 1 is a block diagram of a flash memory system. Memory cell array 1 including a plurality of memory cells M arranged in a matrix is controlled by a column control circuit 2, a row control circuit 3, a c-source control circuit 4 and a c-p-well control circuit 5.

Column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. Row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of a p-type region (labeled as "c-p-well" 11 in FIG. 3) on which the memory cells (M) are formed. The c-source control circuit 4 controls a common source line (labeled as "c-source" in FIG. 2) connected to the memory cells (M). The c-p-well control circuit 5 controls the c-p-well voltage.

Data stored in the memory cells (M) are read out by column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface) connected to external control lines that are connected with controller 20. The command data informs the flash memory of what operation is requested. The input command is transferred to a state machine 8 that controls column control circuit 2, row control circuit 3, the c-source control circuit 4, the c-p-well control circuit 5 and the data input/output buffer 6. State machine 8 can output a status data of the flash memory such as READY/BUSY or PASS/FAIL.

Controller 20 is connected or connectable with a host system such as a personal computer, a digital camera, or a personal digital assistant. It is the host that initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array.

A typical memory system includes one integrated circuit chip 21 that includes controller 20, and one or more integrated circuit chips 22 that each contains a memory array and associated control, input/output and state machine circuits. The trend, of course, is to integrate the memory array and controller circuits of a system together on one or more integrated circuit chips.

The memory system may be embedded as part of the host system, or may be included in a memory card that is removably insertable into a mating socket of host systems. Such a card may include the entire memory system, or the controller and memory array, with associated peripheral circuits, may be provided in separate cards.

Figure 2:
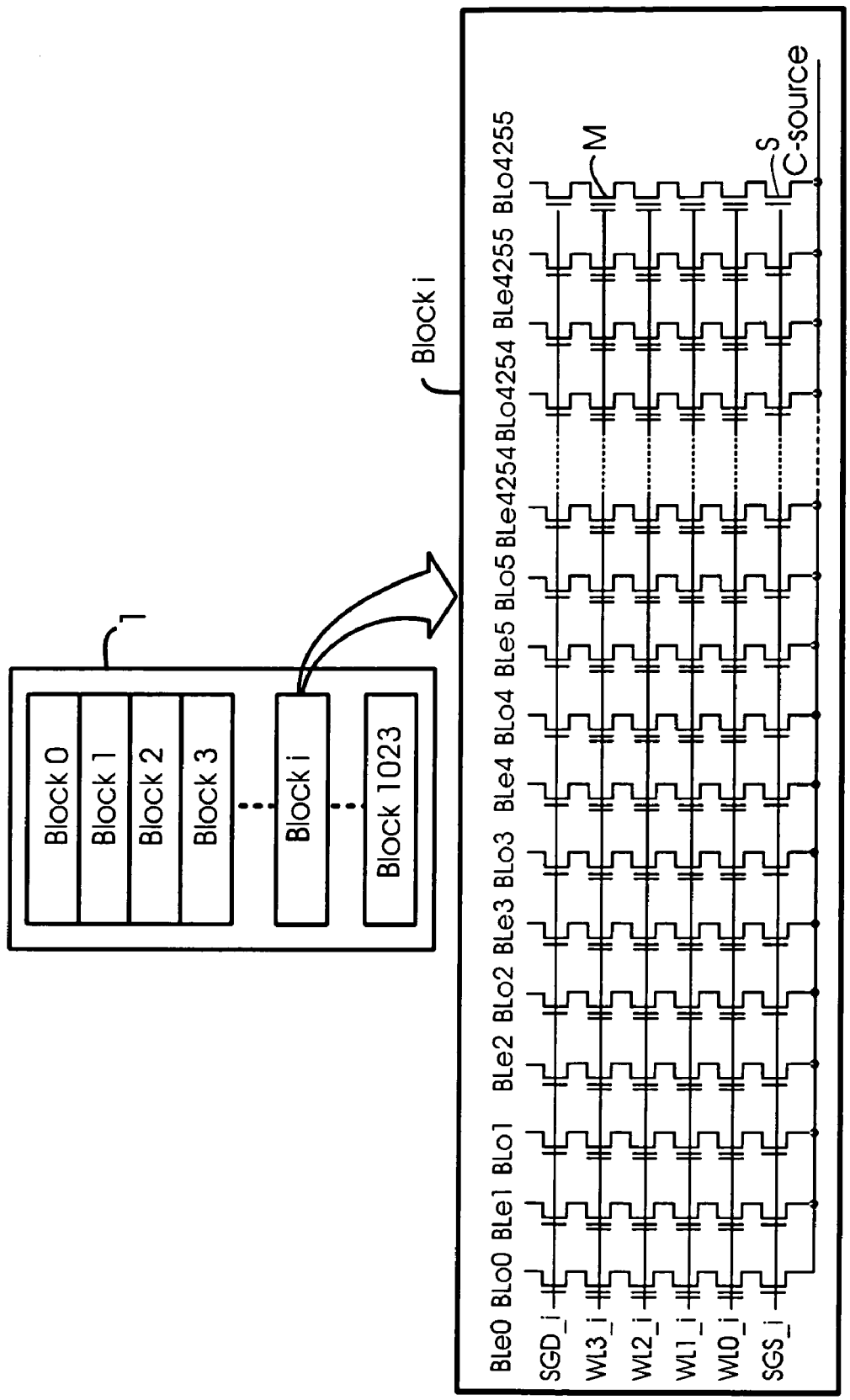
FIG. 2 illustrates an existing circuit and organization of the memory array of FIG. 1 when a NAND type.

With reference to FIG. 2, an example structure of the memory cell array 1 is described. A flash EEPROM of a NAND type is described as an example. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo).

Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although four floating gate transistors are shown to be included in each cell unit, for simplicity, a higher number of transistors, such as 8, 16 or even 32, are used.

During a user data read and programming operation, 4,256 cells (M) are simultaneously selected, in this example. The cells (M) selected have the same word line (WL), for example WL2, and the same kind of bit line (BL), for example the even bit lines BLe0 to BLe4255. Therefore, 532 bytes of data can be read or programmed simultaneously. This 532B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

Figure 3:
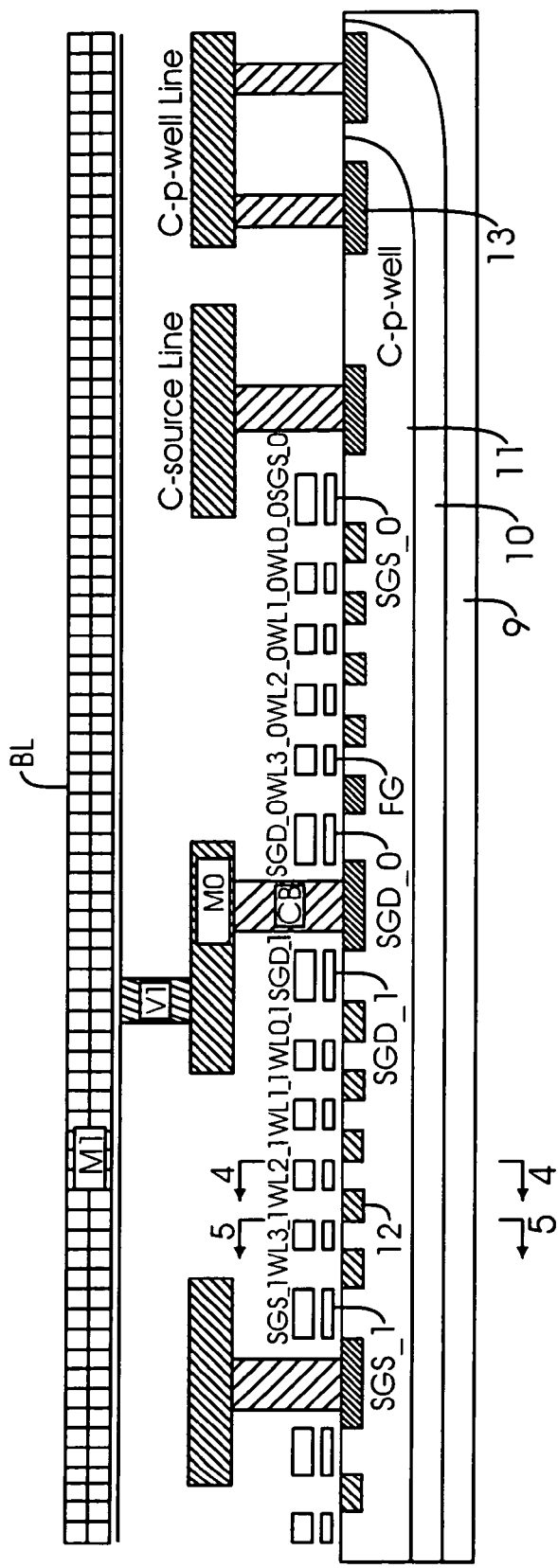
FIG. 3 shows a cross-sectional view, along a column, of a NAND type of memory array formed on a semiconductor substrate.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, the c-p-well being enclosed by an n-type region 10 to electrically isolate the c-p-well from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

Each memory cell has a floating gate (FG) that stores an amount of electric charge corresponding to the data being stored in the cell, the word line (WL) forming the gate electrode, and drain and source electrodes made of the n-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

Figure 4:
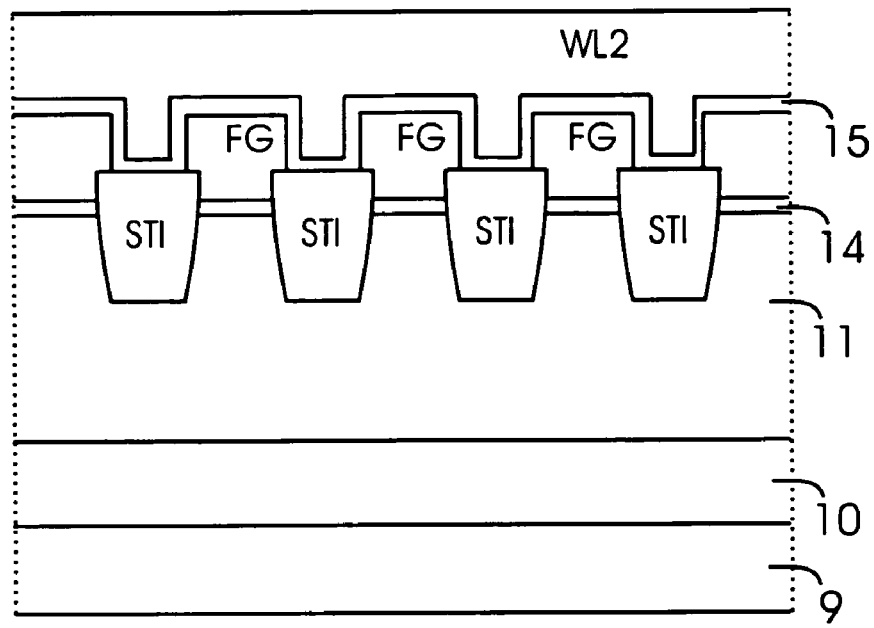
FIG. 4 is a cross-sectional view of the memory array of FIG. 3, taken at section 4-4 thereof.
Figure 5:
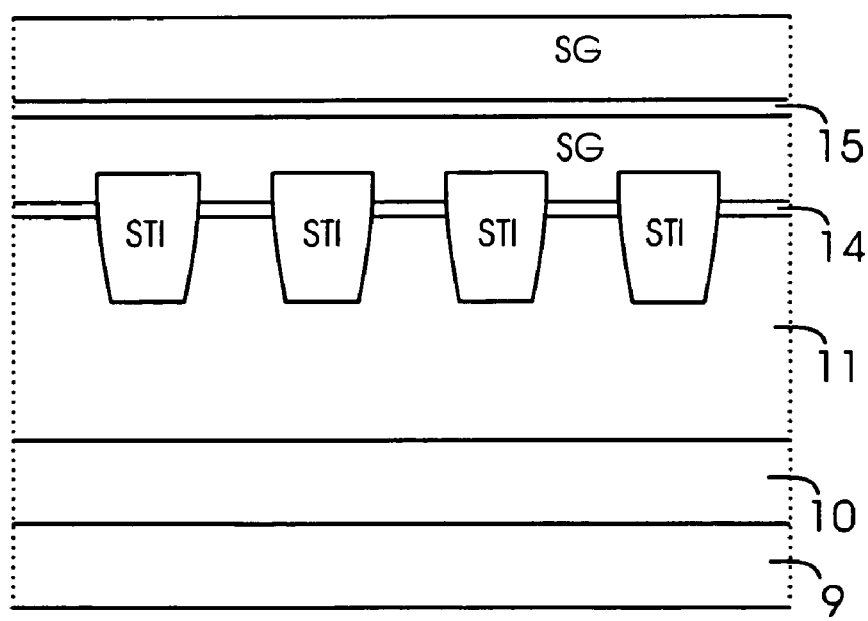
FIG. 5 is a cross-sectional view of the memory array of FIG. 3, taken at section 5-5 thereof.

FIGS. 4 and 5 show cross sectional views of a memory cell (section 4-4 of FIG. 3) and a select transistor (section 5-5 of FIG. 3), respectively, in the direction of the word line. Each column is isolated from the neighbor columns by a trench formed in the substrate and filled with isolation material, known as shallow trench isolation (STI). The floating gates (FG) are isolated from each other by the STI and insulator film 15 and word line (WL). These days, a space between the floating gates (FG) is going to less than 0.1 um, and a capacitive coupling between the floating gates has been increasing. Since the gate electrode (SG) of the select transistor (S) is formed in the same formation process steps as the floating gate (FG) and word line (WL), it shows a stacked gate structure. These two select gate lines (SG) are shunted at the end of lines.

Table 1 of FIG. 6 summarizes voltages applied to operate the memory cell array 1, in a specific example, each memory cell's floating gate storing two bits, having one of the states "11", "10", "01", "00". This table shows the case where the word line "WL2" and the bit lines of "BLe" are selected for reading and programming. By raising the c-p-well to an erase voltage of 20V and grounding the word lines (WL) of a selected block, the data of the selected block is erased. Since all of the word lines (WL) of the unselected blocks, bit lines (BL), select lines (SG) and c-source are put in a floating state, these are also raised to almost 20V due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to Vdd of a power supply, for example 3V, as well as the unselected bit lines BLo. The unselected word lines WL0, WL1 and WL3 are connected to 10V, the first select gate (SGD) is connected to Vdd, and the second select gate (SGS) is grounded. As a result, a channel potential of the memory cell (M) that is being programmed is set at 0V. The channel potential in the program inhibition is raised to around 6V as a result of the channel potential being pulled up by the capacitive coupling with the word lines (WL).

As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In the read and verify operations, the select gates (SGD and SGS) and the unselected word lines (WL0, WL1 and WL3) are raised to a read pass voltage of 4.5V to make these as pass gates. The selected word line (WL2) is connected to a voltage, a level of which is specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY01 operation, the selected word line WL2 is connected to 2.4V, so that it is verified that whether the threshold voltage has reached 2.4V. In this verify case, it can be said that a verify level is 2.4V.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, if the threshold voltage is lower than the read or verify level, the potential level of the concerned bit line (BLe) decreases to a low level, for example less than 0.5V, because of the conductive memory cell (M).

Figure 7:
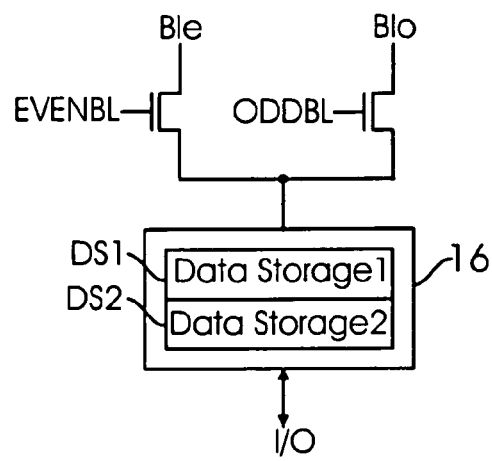
FIG. 7 illustrates another feature of the NAND memory cell array of FIGS. 2-5.

FIG. 7 shows a part of the column control circuit 2 of FIG. 1. Each pair of bit lines (BLe and BLo) is coupled to a data storage portion 16 which includes two data storage (DS1 and DS2) registers, each being capable of storing one bit of data. The data storage portion 16 senses the potential level of the selected bit line (BL) during a read or verify operation and then stores the data in a binary manner, and controls the bit line voltage in the program operation. The data storage portion 16 is selectively connected to the selected bit line (BL) by selecting one of signals of "EVENBL" and "ODDBL". The data storage portion 16 is also coupled to the I/O line to output the read data and to store the program data. The I/O line is connected to the data input/output buffer 6, as described above with respect to FIG. 1.

Figure 8:
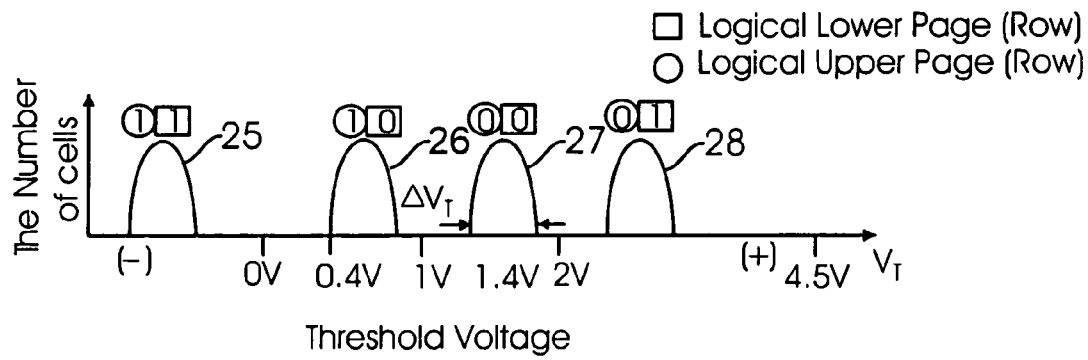
FIG. 8 shows an example existing distribution of threshold voltages of the NAND memory cell array of FIGS. 2-5 when operated in four states.

FIG. 8 illustrates threshold voltage distributions for the memory cell array 1 when each floating gate storage element stores two bits of data, namely four data states, in each memory cell (M). The curve 25 represents a distribution of the threshold levels V.sub.T of the cells within the array 1 that are in the erased state ("11" data state), being negative threshold voltage levels. Threshold voltage distributions 26 and 27 of memory cells storing "10" and "00" user data, respectively, are shown to be between 0V and 1V and between 1V and 2V. A curve 28 shows the distribution of cells that have been programmed to the "01" data state, being the highest threshold voltage level set more than 2V and less than 4.5V of the read pass voltage.

Each of the two bits stored in a single memory cell (M), in this example, is from a different logical page. That is, each bit of the two bits stored in each memory cell carries a different logical page address from each other. The right side bit shown in FIG. 8 is accessed when a lower page address (=0, 2, 4, . . . , 16,382) is input. The left side bit is accessed when an upper page address (=1, 3, 5, . . . , 16,383) is input.

In order to provide improved reliability, it is better for the individual distributions to be tightened (distribution narrowed), because the tighter distribution brings a wider read margin (distance between them).

Figure 9:
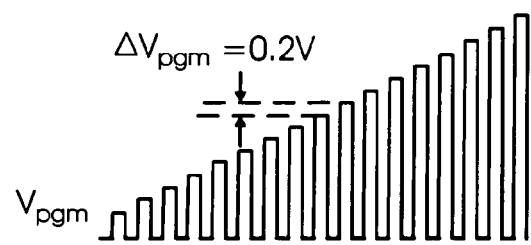
FIG. 9 shows an example programming voltage signal that may be used in the memory cell array of FIGS. 2-5.

FIG. 9 shows an existing programming pulse technique. A programming voltage Vpgm waveform is illustrated. The programming voltage Vpgm is divided into many pulses, and increased 0.2V pulse by pulse. The starting level of Vpgm is 12V, in this particular example.

In periods between the pluses, the verify (read) operations are carried out. That is, the programmed level of each cell being programmed in parallel is read between each programming pulse to determine whether it is equal to or greater than the verify level to which it is being programmed. If it is determined that the threshold voltage of a given memory cell has exceeded the verify level, Vpgm is removed by raising the voltage of the bit line to which the series cell unit of the given cell is connected from 0V to Vdd.

Programming of others of the cells being programmed in parallel continues until they in turn reach their verify levels.

When the threshold voltage moves from below the verify level to above it during the cell's last programming pulse, the shift of the threshold voltage is equal to the Vpgm step size of 0.2V. Therefore, the threshold voltages are controlled within a 0.2V-width.

FIGS. 10A and 10B show programming techniques for a 2LC and 3LC memory cells. The examples illustrate the widening behavior of Vth distribution by coupling effect from neighboring cells. As the number of states increases, smaller delta Vpgm is needed get tighter distribution. Larger coupling requires smaller delta VPGM to get sufficient margin between each state. Smaller delta Vpgm reduces program speed, since more program loops are needed.

The adaptive aspects of the present invention, provide an optimum solution for storing data bits in 0.5 increments (for example, 1.5 bits, 2.5 bits, 3.5 bits and so forth) such that complex calculation circuits are not needed with optimum programming speed.

Referring back to FIG. 10A, segment 32 shows the programming step. In this illustration, programming starts with an even lower page for WL0 and moves to the odd lower page for WL0. After odd lower page of WL0, the even lower page of WL1 is programmed. Thereafter, the odd lower page of WL1 is programmed.

Segment 33 shows the voltage distributions for WL0 even and odd and WL1, even and odd. Curve 29 shows the Vth distribution before any coupling effect, curve 30 shows the coupling effect from WL0 odd and curve 31 shows the coupling effect from WL1 even. Programming the memory cells in FIG. 10A can be achieved using simple logic at high speed.

FIG. 10B shows the distributions for programming a 3LC memory cell. Segment 34 provides the programming layout. Curve 35 shows distribution before any coupling, curve 36 shows the distribution after program disturb in WL0 even from WL0 odd memory cell and curve 37 shows the program disturb due to WL1 even memory cell.

Programming starts with even WL0 memory cell. L signifies lower page, while U denotes an upper page, as used in FIGS. 10A, 10B and 12. First the lower and upper even pages are programmed for WL0. Then the odd lower/upper pages for WL0 are programmed. Thereafter, as indicated by the arrows, WL1 even page is programmed. The foregoing sequence has overall slow programming speed and uses simply logic.

Memory Cell Pattern:

In one aspect of the present invention, a memory cell pattern is provided that does not need complex book-keeping circuits for storing data bits in 0.5 bit increments. A dual state (2LC) and 4 state (4LC) memory cells are used to store 1.5 bits of data. A 4LC and 8LC memory cells can be used to store 2.5 bits of data. An 8LC and 16LC memory cells can be used to store 3.5 bits of data.

FIGS. 11A-11C illustrate the checkered pattern to 1.5 bits, 2.5 bits and 3.5 bits per cell, respectively.

In another aspect of the present invention, a programming sequence/technique is provided to program the checkered patterns of FIGS. 11A-11C. The programming sequence minimizes the need for complex book-keeping logic to keep track of data and provides optimum programming speed.

Figure 12:
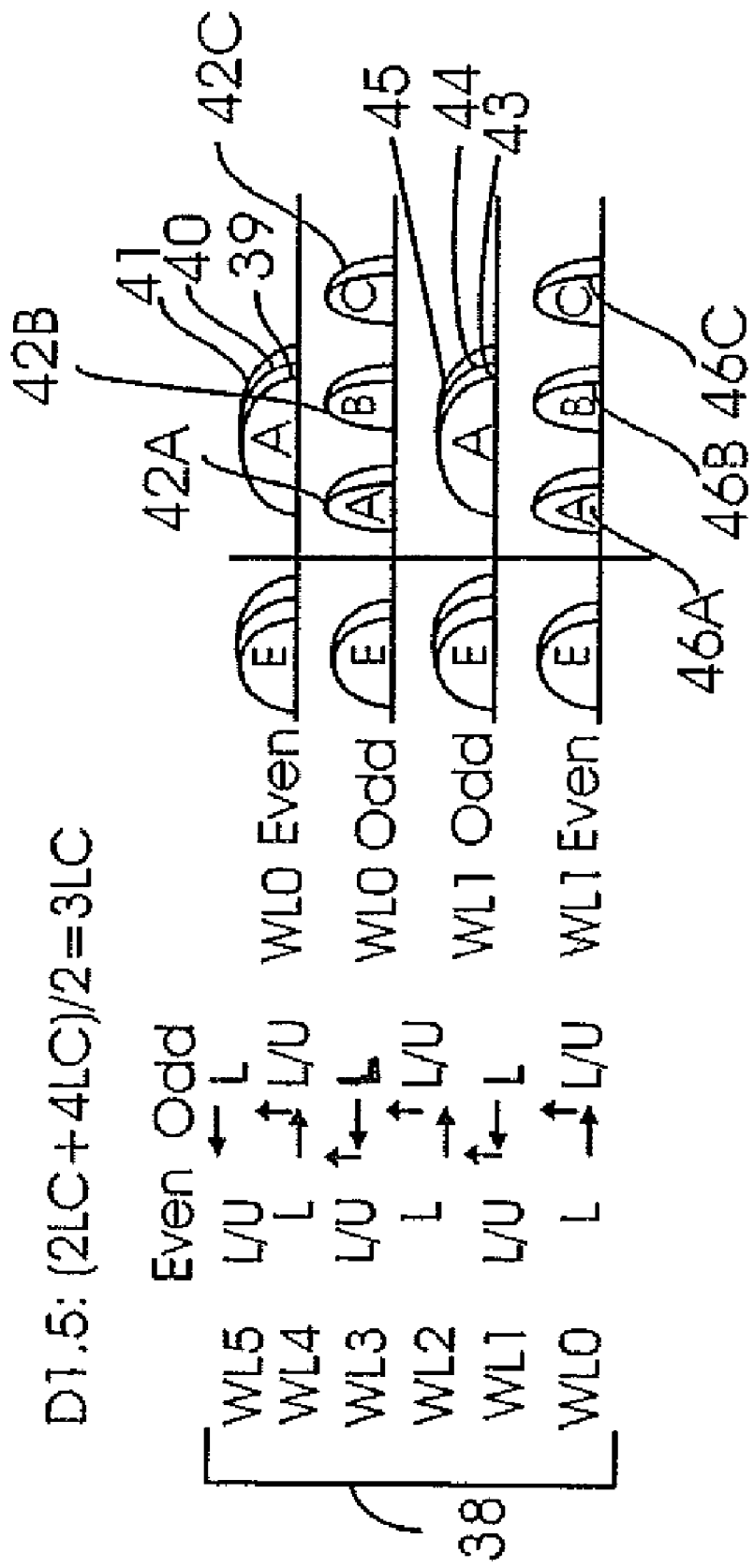
FIG. 12 shows programming techniques for multi-state cells for storing data in 0.5 bit increments, according to one aspect of the present invention.

FIG. 12 shows an example of the programming sequence, according to one aspect of the present invention. Segment 38 shows the overall program sequence. The programming starts at an even lower page for WL0 memory cell (2LC). Curve 39 shows the Vth distribution before coupling. Curve 40 shows the distribution after program disturb from WL0 odd page memory cell (4LC). Curve 41 shows the Vth distribution after program disturb from WL1 even memory cell (4LC). WL0 even memory cell is programmed faster than WL0 odd memory cell, which is programmed after WL0 even memory cell. WL0 odd memory cell is a 4LC memory cell and is programmed at a rate lower than WL0 even memory cell (2LC). The voltage distributions are tighter than WL0 even memory cell, as shown by 42A, 42B and 42C in segment 42.

WL1 odd memory cell is programmed after the lower/upper pages of WL0 odd memory cell (4LC) are programmed. WL1 odd memory cell (for 2LC) is programmed at a higher speed than WL0 odd memory cell (4LC). Curve 43 shows the voltage distribution before program disturb, curve 44 shows voltage distribution after program disturb from WL1 even memory cell and curve 45 shows the distribution after program disturb due to WL2 odd memory cell.

After WL1 odd memory cell is programmed, WL1 even memory cell is programmed. This again is for a 4 state cell. The voltage distributions are shown as 46A, 46B and 46C. WL1 even memory cell is programmed at a speed slower than WL1 odd memory cell.

The programming continues as shown by the arrows in segment 38. For example, after WL1 even memory cell, WL2 even memory cell (2LC cell) is programmed. After WL2 even memory cell, WL2 odd memory cell (4LC cell) is programmed. WL3 odd memory cell (2LC) is programmed next, followed by WL3 even memory cell (4LC). WL4 even memory cell (2LC) is programmed next, followed by WL4 odd memory cell (4LC). WL5 odd memory cell (2LC) is programmed next followed by WL5 even memory cell (4LC); and so forth.

Figure 13:
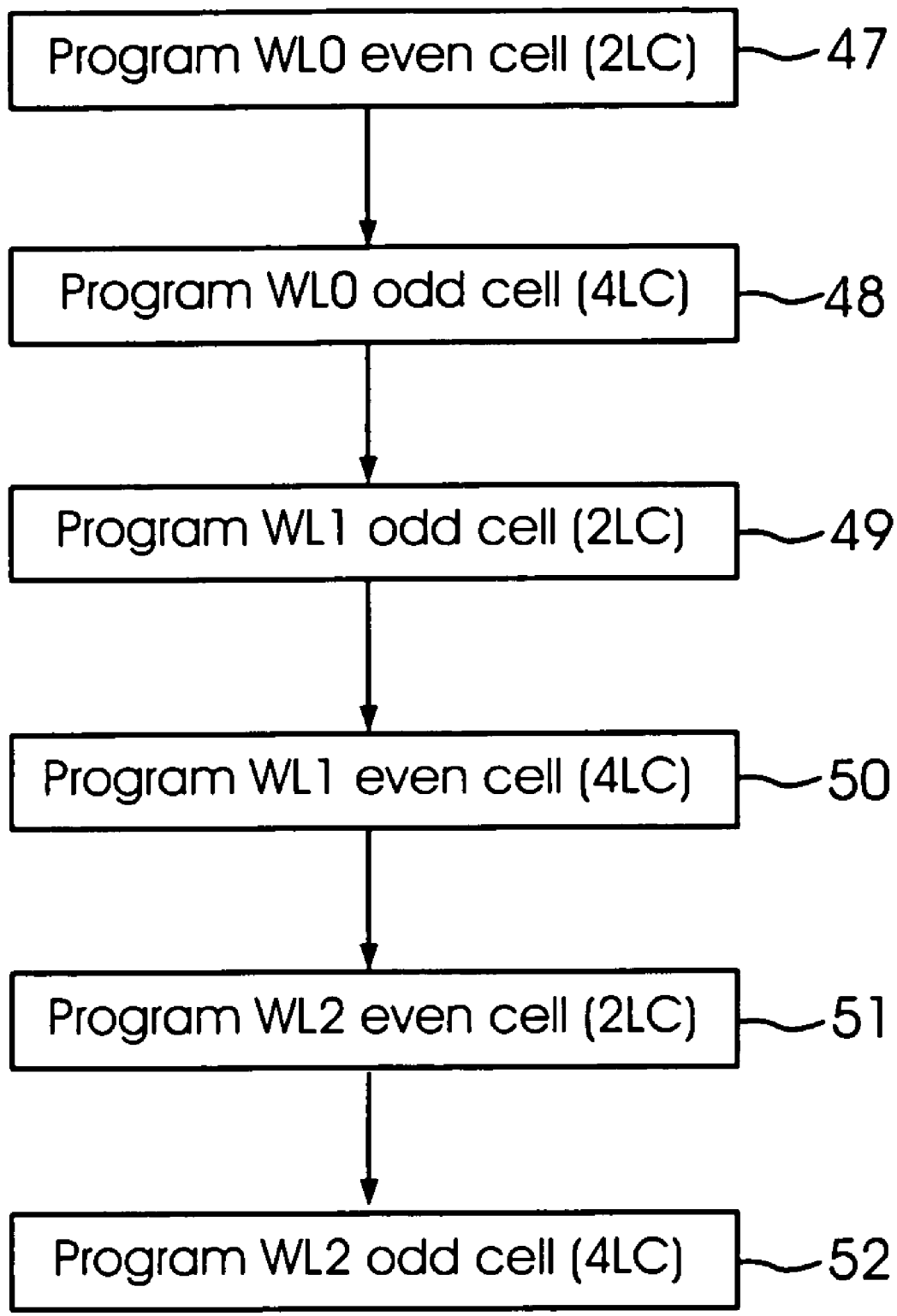
FIG. 13 shows a process flow diagram of a programming technique for multi-state cells for storing data in 0.5 bit increments, according to one aspect of the present invention.

FIG. 13 shows a process flow diagram summarizing the foregoing technique. In step 47, WL0 even memory cell (2LC) is programmed. In step 48, WL0 odd memory cell (4LC) is programmed. In step 49, WL1 odd memory cell (2LC) is programmed. In step 50, WL1 even memory cell (4LC) is programmed. In step 51, WL2 even memory cell (2LC) is programmed and in step 52, WL2 odd memory cell (4LC) is programmed. The process continues until all the cells are programmed.

The foregoing programming sequence can be used for a 4LC/8LC memory cell layout to attain an effective storage capacity of 2.5 bits per cell. The sequence can also be used for 8LC/16LC memory layout to attain an effective storage capacity of 3.5 bits per cell.

It is noteworthy that the programming technique is not limited to pairs of 2LC/4LC, 4LC/8LC and 8LC/16LC and is meant to include generic multiple states, for example, XLC/YLC, where X and Y can be 2, 4, 8, 16 and so forth.

The foregoing layout and programming technique provides optimum programming speed without the need for complex logic that will be required to keep track of 0.5 bits storage. The optimum speed is based on achieving a higher programming speed for the 2LC and a slower programming speed for the 4LC memory cells. The same will apply for a 4LC/8LC and 8LC/16LC memory cell pattern.

Although the present invention has been described with reference to specific embodiments, these embodiments are illustrative only and not limiting. Many other applications and embodiments of the present invention will be apparent in light of this disclosure and the following claims.

What is claimed is:

1. A method for programming a non-volatile memory system having a pattern of multi-state memory cells, the memory system is arranged as alternating even bit lines and odd bit lines of memory cells, wherein the pattern has a first set of memory cells that are programmed to X states and a second set of memory cells that are programmed to Y states, X and Y are different integers, the method comprising:

programming a first memory cell of the first set and a first word line, the first memory cell is associated with a first even bit line, the first memory cell is programmed to one of the X states;

programming a second memory cell in the first word line and of the second set next, the second memory cell is programmed to one of the Y states, the second memory cell is associated with a first odd bit line, the first odd bit line is adjacent to the first even bit line;

programming a third memory cell of the first set and a second word line next, the second word line is a neighbor to the first word line, the third memory cell is associated with the first odd bit line, the third memory cell is programmed to one of the X states; and programming a fourth memory cell of the second set and the second word line next, the fourth memory cell is associated with the first even bit line, the fourth memory cell is programmed to one of the Y states.

2. The method of claim 1, wherein X is 2 states and Y is 4 states, allowing the memory cells to effectively store 1.5 bits per cell.

3. The method of claim 1, wherein X is 4 states and Y is 8 states, allowing the memory cells to effectively store 2.5 bits per cell.

4. The method of claim 1, wherein X is 8 states and Y is 16 states, allowing the memory cells to effectively store 3.5 bits per cell.

5. The method of claim 1, wherein the non-volatile memory system is a flash memory device.

6. A method for programming non-volatile storage elements, the method comprising:

programming a first non-volatile storage element on a first word line and a first NAND string to store n bits of data, "n" is an integer having a value of one or more;

programming a second non-volatile storage element on the first word line and a second NAND string to store n+1 bits of data, the second non-volatile storage element is a neighbor to the first non-volatile storage element;

programming a third non-volatile storage element on a second word line and the second NAND string to store n bits of data, the third non-volatile storage element is a neighbor to the second non-volatile storage element; and programming a fourth non-volatile storage element on the second word line and the first NAND string to store n+1 bits of data.

7. A method as recited in claim 6, wherein the programming the first non-volatile storage element, the programming the second non-volatile storage element, the programming the third non-volatile storage element, and the programming the fourth non-volatile storage element includes programming in the following sequence:

programming the first non-volatile storage element, then programming the second non-volatile storage element next, then programming the third first non-volatile storage element next, then programming the fourth non-volatile storage element next.

8. A method as recited in claim 6, wherein n is 1 such that the programming the first non-volatile storage element, the programming the second non-volatile storage element, the programming the third non-volatile storage element, and the programming the fourth non-volatile storage element results in an average of 1.5 bits stored per non-volatile storage element.

9. The method of claim 6, wherein n is 2 such that the programming the first non-volatile storage element, the programming the second non-volatile storage element, the programming the third non-volatile storage element, and the programming the fourth non-volatile storage element results in an average of 2.5 bits stored per non-volatile storage element.

10. The method of claim 6, wherein n is 3 such that the programming the first non-volatile storage element, the programming the second non-volatile storage element, the programming the third non-volatile storage element, and the programming the fourth non-volatile storage element results in an average of 3.5 bits stored per non-volatile storage element.

11. A method for programming a memory array of non-volatile storage elements, the method comprising:

programming a first group of non-volatile storage elements on a first word line to store n bits of data, the first group of non-volatile storage elements are associated with a first set of bit lines, "n" is an integer having a value of one or more;

programming a second group of non-volatile storage elements on the first word line to store n+1 bits of data, the second group of non-volatile storage elements are associated with a second set of bit lines, individual ones of the second set of bit lines are neighbors to individual ones of the first set of bit lines;

programming a third group of non-volatile storage elements on a second word line to store n bits of data, the third group of non-volatile storage elements are associated with the second set of bit lines, the second word line is a neighbor to the first word line; and programming a fourth group of non-volatile storage elements on the second word line to store n+1 bits of data, the fourth group of non-volatile storage elements are associated with the firs set of bit lines.

12. A method as recited in claim 11, wherein the first group, the second group, the third group, and the fourth group of non-volatile storage elements are programmed in the following sequence:

programming the first group of non-volatile storage elements, then programming the second group of second non-volatile storage elements next, then programming the third group of non-volatile storage elements next, then programming the fourth group of non-volatile storage elements next.

13. A method as recited in claim 11, wherein n is 1 such that the programming the first group of non-volatile storage elements, the programming the second group of non-volatile storage elements, the programming the third group of non-volatile storage elements, and the programming the fourth group of non-volatile storage elements results in an average of 1.5 bits stored per non-volatile storage element.

14. The method of claim 11, wherein n is 2 such that the programming the first group of non-volatile storage elements, the programming the second group of non-volatile storage elements, the programming the third group of non-volatile storage elements, and the programming the fourth group of non-volatile storage elements results in an average of 2.5 bits stored per non-volatile storage element.

15. The method of claim 11, wherein n is 3 such that the programming the first group of non-volatile storage elements, the programming the second group of non-volatile storage elements, the programming the third group of non-volatile storage elements, and the programming the fourth group of non-volatile storage elements results in an average of 3.5 bits stored per non-volatile storage element.

16. The method of claim 11, wherein the first set of bit lines are even bit lines and the second set of bit lines are odd bit lines.

17. The method of claim 11, wherein the first set of bit lines are odd bit lines and the second set of bit lines are even bit lines.

* * * * *

UNITED STATES PATENT AND TRADEMARK OFFICE
CERTIFICATE OF CORRECTION

| | |
|---|---|
| PATENT NO. | : 7,518,911 B2 |
| APPLICATION NO. | : 11/440511 |
| DATED | : April 14, 2009 |
| INVENTOR(S) | : Kameii |

Page 1 of 1

It is certified that error appears in the above-identified patent and that said Letters Patent is hereby corrected as shown below:

Col. 10, line 27 Claim 11: After "the" and before "set" delete "firs" and substitute --first--

Signed and Sealed this

First Day of September, 2009

David J. Kappos
*Director of the United States Patent and Trademark Office*